US012175177B2

United States Patent
Lee et al.

(10) Patent No.: US 12,175,177 B2
(45) Date of Patent: Dec. 24, 2024

(54) METHOD AND APPARATUS WITH SYSTEM VERIFICATION BASED ON REINFORCEMENT LEARNING

(71) Applicant: SAMSUNG ELECTRONICS CO., LTD., Suwon-si (KR)

(72) Inventors: Jun Haeng Lee, Hwaseong-si (KR); Youngmin Oh, Suwon-si (KR); Hyun Sun Park, Seoul (KR); Yongwoo Lee, Hwaseong-si (KR); Jaecheol Lee, Suwon-si (KR); Hyojin Choi, Seoul (KR); Younsik Park, Hwaseong-si (KR); Seungju Kim, Suwon-si (KR); Changwook Jeong, Hwaseong-si (KR); In Huh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 499 days.

(21) Appl. No.: 16/694,498

(22) Filed: Nov. 25, 2019

(65) Prior Publication Data

US 2020/0364314 A1  Nov. 19, 2020

(30) Foreign Application Priority Data

May 13, 2019  (KR) .................... 10-2019-0055795

(51) Int. Cl.
G06F 30/33   (2020.01)
G06F 30/27   (2020.01)
G06N 20/00   (2019.01)

(52) U.S. Cl.
CPC .............. *G06F 30/33* (2020.01); *G06F 30/27* (2020.01); *G06N 20/00* (2019.01)

(58) Field of Classification Search
CPC ...... G06F 30/33; G06F 30/27; G06F 30/3308; G06F 30/3315; G06F 30/30; G06F 30/31;
(Continued)

(56) References Cited

U.S. PATENT DOCUMENTS 6,845,479 B2   1/2005  Illman
6,865,706 B1   3/2005  Rohrbaugh et al.
(Continued)

OTHER PUBLICATIONS

Choi, Jinyoung, et al. "Deep reinforcement learning of navigation in a complex and crowded environment with a limited field of view." 2019 International Conference on Robotics and Automation (ICRA). IEEE, 2019. (Year: 2019).*

(Continued)

*Primary Examiner* — Michael Edward Cocchi
(74) *Attorney, Agent, or Firm* — NSIP Law

(57) ABSTRACT

A system verification method includes generating a first verification vector as a result of a first action of an agent, the first verification vector referring to an observation corresponding to at least one state already covered, from among states of elements of a target system, identifying a first coverage corresponding to at least one state covered by the first verification vector, from among the states of the elements, updating the observation by reflecting the first coverage in the observation, and generating a second verification vector through a second action of the agent, the second verification vector referring to the updated observation.

18 Claims, 17 Drawing Sheets

(58) Field of Classification Search
CPC ...... G06F 30/32; G06F 30/323; G06F 30/333; G06F 30/337; G06F 30/34; G06F 30/343; G06F 30/347; G06F 30/38; G06F 30/20; G06F 30/25; G06F 30/28; G06N 20/00; G06N 3/006

See application file for complete search history.

(56) References Cited

U.S. PATENT DOCUMENTS

| | | | |
|---|---|---|---|
| 7,281,185 | B2 | 10/2007 | Maoz et al. |
| 7,395,473 | B2 | 7/2008 | Cheng et al. |
| 7,478,028 | B2 | 1/2009 | Ho et al. |
| 7,617,468 | B2 * | 11/2009 | Thakur ............... G06F 30/398 716/106 |
| 8,407,639 | B2 | 3/2013 | Redekopp |
| 8,892,487 | B2 | 11/2014 | Chang et al. |
| 9,256,371 | B2 | 2/2016 | Franceschini et al. |
| 9,792,397 | B1 * | 10/2017 | Nagaraja ............... G06F 30/32 |
| 9,965,901 | B2 | 5/2018 | Zhang et al. |
| 10,084,476 | B1 | 9/2018 | Zhao et al. |
| 2002/0133776 | A1 * | 9/2002 | Illman ............ G01R 31/31835 714/738 |
| 2005/0131665 | A1 * | 6/2005 | Ho ............... G01R 31/318307 703/14 |
| 2006/0026479 | A1 | 2/2006 | Umehara et al. |
| 2006/0156144 | A1 | 7/2006 | Cheng et al. |
| 2012/0198402 | A1 | 8/2012 | Redekopp |
| 2012/0317526 | A1 * | 12/2012 | Sato ............... G06F 30/33 716/103 |
| 2014/0310220 | A1 | 10/2014 | Chang et al. |
| 2014/0359197 | A1 | 12/2014 | Franceschini et al. |
| 2017/0148226 | A1 | 5/2017 | Zhang et al. |
| 2017/0344669 | A1 * | 11/2017 | Jeong ............... G06F 30/3323 |
| 2018/0026649 | A1 | 1/2018 | Harik |
| 2022/0092456 | A1 * | 3/2022 | Piot ............... G06N 3/045 |

OTHER PUBLICATIONS

Diao, Ruisheng, et al. "Autonomous voltage control for grid operation using deep reinforcement learning." 2019 IEEE Power & Energy Society General Meeting (PESGM). IEEE, 2019. (Year: 2019).*

Singh, Karunveer, et al. "A Hybrid Framework for Functional Verification using Reinforcement Learning and Deep Learning." Proceedings of the 2019 on Great Lakes Symposium on VLSI. 2019. (Year: 2019).*

Ioannides, Charalambos, and Kerstin I. Eder. "Coverage-directed test generation automated by machine learning—a review." ACM Transactions on Design Automation of Electronic Systems (TODAES) 17.1 (2012): 1-21. (Year: 2012).*

Chen, Xiaoding, et al. *Exploring Temporal and Spatial Correlations on Circuit Variables for Enhancing Simulation-based Test Generation*. Diss. Virginia Tech, 2006. (150 pages, in English).

* cited by examiner

FIG. 4
400

Table (lower portion):

| IN1 | IN2 | IN3 | Q1 | Q2 | Discard | Cover |
|---|---|---|---|---|---|---|
| 0 | 0 | 0 | 0 | 0 |  | 1 |
| 0 | 0 | 0 | 0 | 1 |  | 1 |
| 0 | 0 | 0 | 1 | 0 |  | 1 |
| 0 | 0 | 0 | 1 | 1 |  | 1 |
| 0 | 0 | 1 | 0 | 0 |  | — |
| 0 | 0 | 1 | 0 | 1 | 1 | 1 |
| 0 | 0 | 1 | 1 | 0 |  | — |
| 0 | 0 | 1 | 1 | 1 | 1 | 1 |
| 0 | 1 | 0 | 0 | 0 |  | 1 |
| 0 | 1 | 0 | 0 | 1 |  | 1 |
| 0 | 1 | 0 | 1 | 0 |  | 1 |
| 0 | 1 | 0 | 1 | 1 |  | 1 |
| 0 | 1 | 1 | 0 | 0 |  | 1 |
| 0 | 1 | 1 | 0 | 1 | 1 | — |
| 0 | 1 | 1 | 1 | 0 |  | 1 |
| 0 | 1 | 1 | 1 | 1 | 1 | — |

410

Table (upper portion):

| IN1 | IN2 | IN3 | Q1 | Q2 | Discard | Cover |
|---|---|---|---|---|---|---|
| 1 | 0 | 0 | 0 | 0 |  | 1 |
| 1 | 0 | 0 | 0 | 1 |  | 1 |
| 1 | 0 | 0 | 1 | 0 |  | 1 |
| 1 | 0 | 0 | 1 | 1 |  | 1 |
| 1 | 0 | 1 | 0 | 0 |  | 1 |
| 1 | 0 | 1 | 0 | 1 | 1 | — |
| 1 | 0 | 1 | 1 | 0 |  | 1 |
| 1 | 0 | 1 | 1 | 1 | 1 | — |
| 1 | 1 | 0 | 0 | 0 |  | 1 |
| 1 | 1 | 0 | 0 | 1 |  | 1 |
| 1 | 1 | 0 | 1 | 0 |  | 1 |
| 1 | 1 | 0 | 1 | 1 |  | 1 |
| 1 | 1 | 1 | 0 | 0 |  | — |
| 1 | 1 | 1 | 0 | 1 | 1 | 1 |
| 1 | 1 | 1 | 1 | 0 |  | — |
| 1 | 1 | 1 | 1 | 1 | 1 | 1 |

FIG. 9

| instruction | symbol | Prev. CKE | Pres. CKE | CS_n | ACT_n |
|---|---|---|---|---|---|
| MODE REGISTER SET | MRS | H | H | L | H |
| REFRESH | REF | H | H | L | H |
| Self refresh entry | SRE | H | L | L | H |
| Self refresh exit | SRX | ⋮ | ⋮ | ⋮ | ⋮ |
| Single-bank PRECHARGE | PRE | ⋮ | ⋮ | ⋮ | ⋮ |
| PRECHARGE all banks | PREA | ⋮ | ⋮ | ⋮ | ⋮ |
| Reserved for future use | RFU | ⋮ | ⋮ | ⋮ | ⋮ |
| Bank ACTIVATE | ACT | ⋮ | ⋮ | ⋮ | ⋮ |
| WRITE | WR | ⋮ | ⋮ | ⋮ | ⋮ |
| READ | RD | ⋮ | ⋮ | ⋮ | ⋮ |
| NO OPERATION | NOP | ⋮ | ⋮ | ⋮ | ⋮ |
| Device DESELECTED | DES | ⋮ | ⋮ | ⋮ | ⋮ |
| Power-down entry | PDE | ⋮ | ⋮ | ⋮ | ⋮ |
| Power-down exit | PDX | ⋮ | ⋮ | ⋮ | ⋮ |
| ZQ CALIBRATION LONG | ZQCL | ⋮ | ⋮ | ⋮ | ⋮ |
| ZQ CALIBRATION SHORT | ZQCS | ⋮ | ⋮ | ⋮ | ⋮ |

FIG. 13

Step0
-bitmap : 0000000

|  | $S_0$ | $S_1$ | $S_2$ | $S_3$ | $S_4$ | $S_5$ | $S_6$ |  |
|---|---|---|---|---|---|---|---|---|
| $a_0$ |  | 1 |  |  | 1 |  | 1 | 3 |
| $a_1$ |  |  | 1 |  | 1 | 1 |  | 3 |
| $a_2$ |  | 1 | 1 |  |  |  |  | 2 |
| $a_3$ | 1 |  |  |  | 1 |  |  | 2 |
| $a_4$ |  |  |  | 1 |  |  |  | 1 |
| $a_5$ |  |  | 1 |  | 1 | 1 |  | 3 |

$a_0$

Step1
-bitmap : 0100101

|  | $S_0$ | $S_1$ | $S_2$ | $S_3$ | $S_4$ | $S_5$ | $S_6$ |  |
|---|---|---|---|---|---|---|---|---|
| $a_0$ |  | 0 |  |  | 0 |  | 0 | 0 |
| $a_1$ |  |  | 1 |  | 0 | 1 |  | 2 |
| $a_2$ |  | 0 | 1 |  |  |  |  | 1 |
| $a_3$ | 1 |  |  |  | 0 |  |  | 1 |
| $a_4$ |  |  |  | 1 |  |  |  | 1 |
| $a_5$ |  |  | 1 |  | 0 | 1 |  | 2 |

$a_0 \to a_5$

Step2
-bitmap : 0110111

|  | $S_0$ | $S_1$ | $S_2$ | $S_3$ | $S_4$ | $S_5$ | $S_6$ |  |
|---|---|---|---|---|---|---|---|---|
| $a_0$ |  | 0 |  |  | 0 |  | 0 | 0 |
| $a_1$ |  |  | 0 |  | 0 | 0 |  | 0 |
| $a_2$ |  | 0 | 0 |  |  |  |  | 0 |
| $a_3$ | 1 |  |  |  | 0 |  |  | 1 |
| $a_4$ |  |  |  | 1 |  |  |  | 1 |
| $a_5$ |  |  | 0 |  | 0 | 0 |  | 0 |

$a_0 \to a_5 \to a_3 \to a_4$

METHOD AND APPARATUS WITH SYSTEM VERIFICATION BASED ON REINFORCEMENT LEARNING

CROSS-REFERENCE TO RELATED APPLICATIONS

This application claims the benefit under 35 USC 119(a) of Korean Patent Application No. 10-2019-0055795 filed on May 13, 2019 in the Korean Intellectual Property Office, the entire disclosure of which is incorporated herein by reference for all purposes.

BACKGROUND

1. Field

The following description relates to a method with system verification that implements reinforcement learning. The following description also relates to an apparatus with system verification that implements reinforcement learning.

2. Description of Related Art

Due to the complexity of digital circuit design technology and the diversity of digital circuit design products, verification of a circuit design has become more and more complicated. However, a current circuit design or product verification process is performed using a rule based scenario verification scheme based on the experience of engineers. There is no circuit design or product-specific absolute evaluation criteria. Thus, due to the advances in circuit design or products and the change in usage of such technology by providers, an existing verification scheme may not guarantee the quality or performance. As a result, there may be a significant loss in productivity during solutions used to guarantee quality or performance through post-correction and testing.

In order to solve such issues, there have been attempts to improve the verification process by introducing an artificial intelligence-based process. For example, there have been attempts to use a machine learning algorithm. However, there is no numerical metric for evaluating the verification situation. Also, the length of a verification vector, an amount of computation, and the non-typicality exceed the processing limit of the machine learning algorithm, and the simulation cost required for obtaining data for typical machine learning is very large.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a system verification method includes generating a first verification vector as a result of a first action of an agent, the first verification vector referring to an observation corresponding to at least one state already covered, from among states of elements of a target system, identifying a first coverage corresponding to at least one state covered by the first verification vector, from among the states of the elements, updating the observation by reflecting the first coverage in the observation, and generating a second verification vector through a second action of the agent, the second verification vector referring to the updated observation.

The system verification method may further include training the agent based on the second verification vector.

The generating of the first verification vector may include generating the first verification vector using a template corresponding to a combination of commands used in the target system.

The system verification method may further include adding first action information related to the first action to an action pool, in response to the first action information being absent from the action pool.

The system verification method may further include generating a training data set by combining at least a portion of actions present in the action pool based on coverages of the actions present in the action pool, and training the agent using the training data set.

The generating of the training data set may include determining a sequence of at least a portion of the actions present in the action pool, and generating the training data set based on the determined sequence.

The training may be performed asynchronously with respect to the generating of the first verification vector and the identifying.

The system verification method may further include, in response to commands included in the first action including at least one command not contributing to the first coverage, excluding data related to the at least one command from the first action information.

The identifying may include measuring the first coverage by simulating the target system using the first verification vector, in response to first action information related to the first action being absent from an action pool, and obtaining the first coverage from the first action information, in response to the first action information being present in the action pool.

The system verification method may further include providing a reward based on a range of the states included in the first coverage.

The target system may correspond to either one or both of a circuit and a machine.

The states of the elements may correspond to inputs of the elements.

The system verification method may further include determining a verification vector set based on verification vectors already generated, in response to a cumulative coverage corresponding to the observation reaching a target value.

In another general aspect, a non-transitory computer-readable storage medium stores instructions that, when executed by a processor, cause the processor to perform the method described above.

In another general aspect, a system verification apparatus, includes one or more processors configured to generate a first verification vector as a result of a first action of an agent, the first verification vector referring to an observation corresponding to at least one state already covered, from among states of elements of a target system, identify a first coverage corresponding to at least one state covered by the first verification vector, from among the states of the elements, update the observation by reflecting the first coverage in the observation, and generate a second verification vector through a second action of the agent, the second verification vector referring to the updated observation.

The system verification apparatus may further include a memory configured to store instructions, wherein the processor is further configured to execute the instructions to configure the processor to generate the first verification vector as the result of the first action of the agent, the first verification vector referring to the observation corresponding to the at least one state already covered, from among the states of the elements of the target system, identify the first coverage corresponding to the at least one state covered by the first verification vector, from among the states of the elements, update the observation by reflecting the first coverage in the observation, and generate the second verification vector through the second action of the agent, the second verification vector referring to the updated observation.

The one or more processors may be configured to train the agent based on the second verification vector.

The one or more processors may be configured to generate the first verification vector using a template corresponding to a combination of commands used in the target system.

The one or more processors may be configured to add first action information related to the first action to an action pool, in response to the first action information being absent from the action pool.

The one or more processors may be configured to generate a training data set by combining at least a portion of actions present in the action pool based on coverages of the actions present in the action pool, and train the agent with the training data set.

The one or more processors may be configured to measure the first coverage by simulating the target system with the first verification vector, in response to first action information related to the first action being absent from an action pool, and obtain the first coverage from the first action information, in response to the first action information being present in the action pool.

The one or more processors may be configured to provide a reward based on a range of the states included in the first coverage.

The one or more processors may be configured to determine a verification vector set based on verification vectors generated thus far, in response to a cumulative coverage corresponding to the observation reaching a target value.

In another general aspect, a system verification method includes generating a first verification vector as a result of a first action of an agent, the first verification vector referring to an observation corresponding to at least one state already covered, from among states of elements of a target system, identifying a first coverage corresponding to at least one state covered by the first verification vector, from among the states of the elements, adding first action information related to the first action to an action pool, in response to the first action information being absent from the action pool, generating a training data set by combining at least a portion of actions present in the action pool based on coverages of the actions present in the action pool, and training the agent using the training data set.

The system verification method may further include updating the observation by reflecting the first coverage in the observation, and generating a second verification vector through a second action of the agent, the second verification vector referring to the updated observation.

The identifying may include measuring the first coverage by simulating the target system using the first verification vector, in response to first action information related to the first action being absent from an action pool, and obtaining the first coverage from the first action information, in response to the first action information being present in the action pool.

The system verification method may further include providing a reward based on a range of the states included in the first coverage.

Other features and aspects will be apparent from the following detailed description, the drawings, and the claims.

BRIEF DESCRIPTION OF THE DRAWINGS

FIG. 4 illustrates an example of states of unit elements.

FIGS. 8 through 11 illustrate examples of generating an action using a template.

FIG. 13 illustrates an example of generating a training data set.

Figure 1:
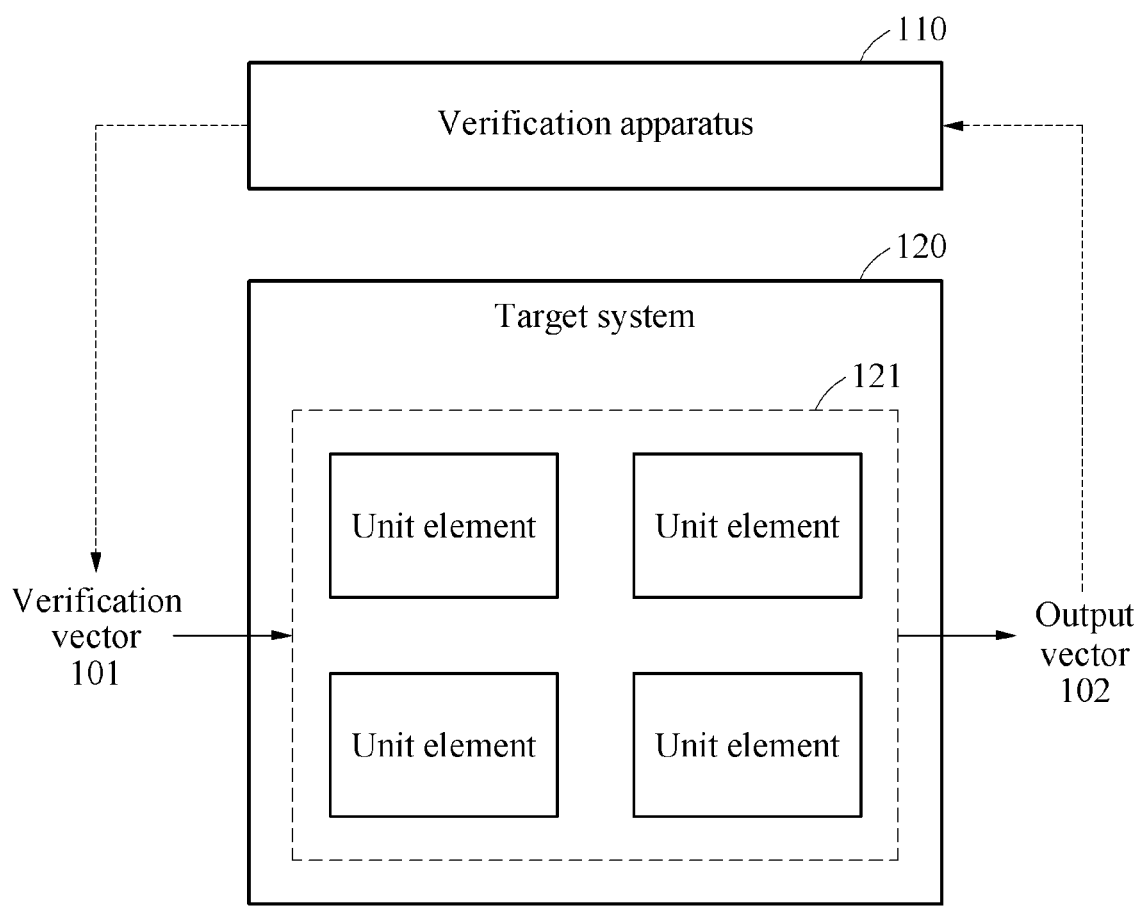
FIG. 1 illustrates an example of a reinforcement learning based system verification apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

For example, the following detailed structural or functional description is provided as an example only and various alterations and modifications may be made to the examples. Accordingly, the examples are not construed as being limited to the disclosure and should be understood to include all changes, equivalents, and replacements within the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, operations, elements, components and/or groups thereof.

Unless otherwise defined, all terms, including technical and scientific terms, used herein have the same meaning as commonly understood by one of ordinary skill in the art to which this disclosure pertains after an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Hereinafter, examples will be described in detail with reference to the accompanying drawings. In the drawings, like reference numerals are used for like elements. Further, herein, it is noted that use of the term "may" with respect to an example or embodiment, e.g., as to what an example or embodiment may include or implement, means that at least one example or embodiment exists where such a feature is included or implemented while all examples and embodiments are not limited thereto.

FIG. 1 illustrates an example of a reinforcement learning based system verification apparatus. A verification apparatus 110 may verify a target system 120. The verification apparatus 110 generates a verification vector 101, inputs the verification vector 101 into the target system 120, and obtains an output vector 102 output by the target system 120 in response to the verification vector 101 being input. The verification apparatus 110 may verify the target system 120 based on the verification vector 101 and the output vector 102. For example, there may exist a predicted output mapped to the verification vector 101. The predicted output may refer to data predicted to be output by the target system 120 in response to the verification vector 101 being input, when the target system 120 operates normally. The verification apparatus 110 may verify the target system 120 by comparing the output vector 102 to the predicted output.

The target system 120 may correspond to at least one of a circuit or a machine, or may correspond to various systems or hardware having specialize functions. Further, the target system 120 may include unit elements 121. In an example, when the target system 120 corresponds to a circuit, the unit elements 121 each include at least one circuit or hardware processing element. In an example, the target system 120 corresponds to a machine, e.g., with multiple processors, where the unit elements 121 may each include one or more processors. The target system 120 may also include one or more memories storing instructions, which when executed by the one or more processors, configure the one or more processors to implement any, any combination, or all operations described herein, where the processor and the memory may provide functionality by being programmed with appropriate software.

The unit elements 121 may have respective states. A verification coverage may be determined based on an appropriate state transition. For example, the states of the unit elements 121 may correspond to at least one of inputs, outputs, and internal states of the unit elements 121. The verification coverage may indicate a range of the target system 120 verified by each verification vector 101, and is simply referred to as a coverage. The verification apparatus 110 may define the coverage based on the states of the unit elements 121, and may use the coverage as a criterion for evaluating the performance of each verification vector 101. Accordingly, the verification apparatus 110 may accurately evaluate the performance of each verification vector 101 and may efficiently search for a verification vector 101 based on the data included in such a vector that is indicative of the level of success of the target system 120.

The verification apparatus 110 may generate a verification vector 101 based on reinforcement learning. An action generated by an agent of reinforcement learning may correspond to the verification vector 101, and a reward may be provided based on a coverage corresponding to the generated action. For example, the wider the coverage of the action, the greater the reward that may be provided. The agent may be trained to generate an action that secures a relatively wide coverage. Thus, the agent may efficiently search for a verification vector 101.

Figure 2:
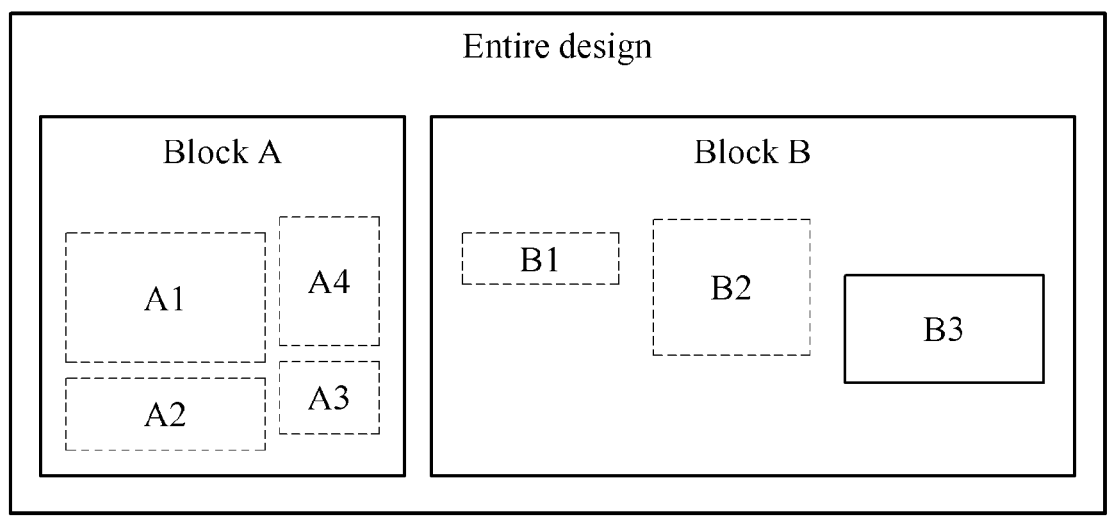
FIG. 2 illustrates an example of a target system.

FIG. 2 illustrates an example of a target system. Referring to the example of FIG. 2, the entire design may be divided into blocks. For example, the entire design may be divided into large blocks, and the large blocks may be divided into smaller blocks. In the example of FIG. 2, a block A and a block B may correspond to large blocks, and blocks A1 through A4 and blocks B1 through B3 may be smaller blocks. A target system may correspond to the entire design, or may corresponds to a predetermined block in the entire design. When designing a system, blocks may be designed and then, the entire system may be designed through a combination of the blocks. A verification scheme may be used for verifying the blocks after the blocks are designed, or may be used for verifying the entire system when the entire system is designed. Subsequently, a verification process for a single small block, for example, the block B3, is described further, which, however, is provided only for ease of description. The following description may also be applicable to the whole or another portion of the entire design.

Figure 3:
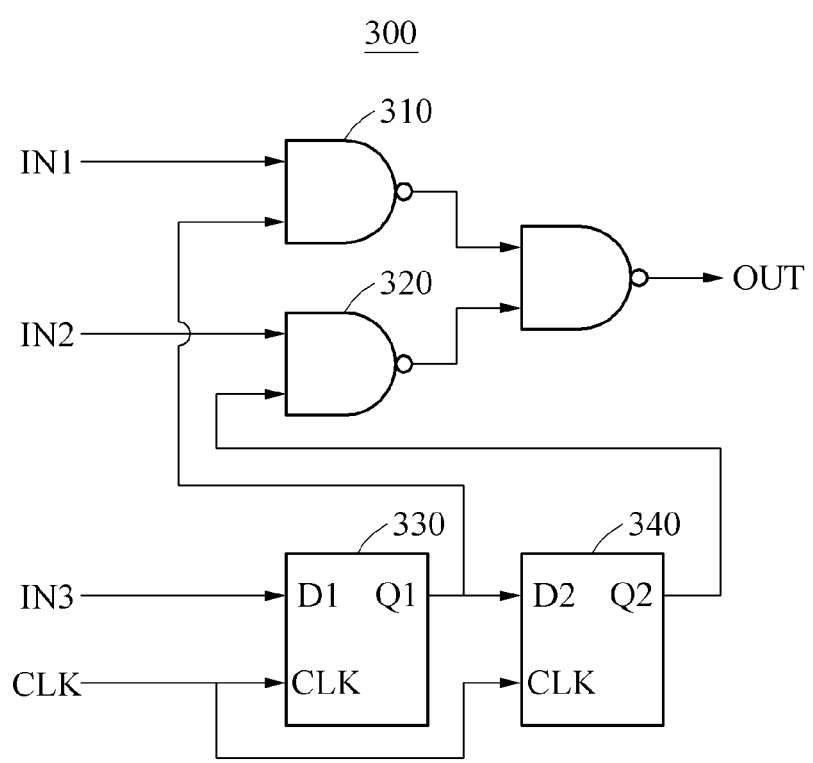
FIG. 3 illustrates an example of a block of interest.

FIG. 3 illustrates an example of a block of interest. The block of interest may refer to a target system to be verified. Subsequently, an example in which the target system corresponds to a circuit, and the individual block corresponds to a designated block of the circuit or portion is described further, which, however, is provided only for ease of description, e.g., of an integrated circuit, e.g. processing blocks and/or memory blocks, as non-limiting examples. The following description may also be applicable to an example in which the target system is a system other than a circuit.

Referring to the example of FIG. 3, a block of interest 300 may include a plurality of circuit elements. At least a portion of unit elements in the target system may be selected as representative unit elements, and states of the representative unit elements may be used to define a coverage. For example, at least a portion of unit elements directly receiving a verification vector, among the unit elements in the target system, may be selected as the representative unit elements. In the example of FIG. 3, because circuit elements 310, 320, and 330 may receive inputs IN1, IN2, and IN3, respectively, the circuit elements 310, 320, and 330 may correspond to representative unit elements. Thus, a coverage may be defined based on states of the circuit elements 310, 320, and 330.

Meanwhile, the circuit element 310 may receive an input Q1 corresponding to an output of the circuit element 330 in addition to the input IN1, and the circuit element 320 may receive an input Q2 corresponding to an output of a circuit element 340 in addition to the input IN2. The inputs IN1 and IN2 are also referred to as external inputs for the circuit elements 310 and 320, respectively. The inputs Q1 and Q2 are also referred to as internal inputs for the circuit elements 310 and 320, respectively. The inputs for the circuit elements 310, 320, and 330 may be construed as including both internal inputs and external inputs.

For example, the example states of the circuit elements 310, 320, and 330 that may correspond to the inputs for the circuit elements 310, 320, and 330. In such an example, a coverage of the block of interest 300 is defined based on the inputs IN1, IN2, IN3, Q1, and Q2 including the external inputs and the internal inputs for the circuit elements 310, 320, and 330.

FIG. 4 illustrates an example of states of unit elements. Referring to the example of FIG. 4, a table 400 illustrates respective states of the inputs IN1, IN2, IN3, Q1, and Q2 with respect to the example of FIG. 3. The states of the inputs IN1, IN2, IN3, Q1, and Q2 are all states of unit elements of a target system to be covered, such as by verification vectors. For example, when states of a block 410 are verified by a verification vector, a coverage of the verification vector corresponds to the block 410.

The table 400 further includes information related to bits indicating values for "Discard" and "Cover." "Discard" indicates a case in which a verification is unnecessary, such as a state which is infeasible according to a design intent. "Cover" indicates whether a state is covered by a verification vector. Examples corresponding to "Discard" may be excluded from all the states of the unit elements.

A verification apparatus may define all the states of the unit elements of the target system to be covered as shown in the table 400, and may identify a coverage covered based on each verification vector. The verification apparatus may provide an agent with a reward corresponding to the coverage, and the agent may generate a verification vector such that the coverage widens. Further, the verification apparatus may figure out a sequence of verification vectors that effectively widen the coverage by accumulating the verification vectors and information related to the corresponding coverage while generating the verification vectors. The verification apparatus trains the agent through using the sequence, thereby increasing the effectiveness of a search process for verification vectors.

Figure 5:
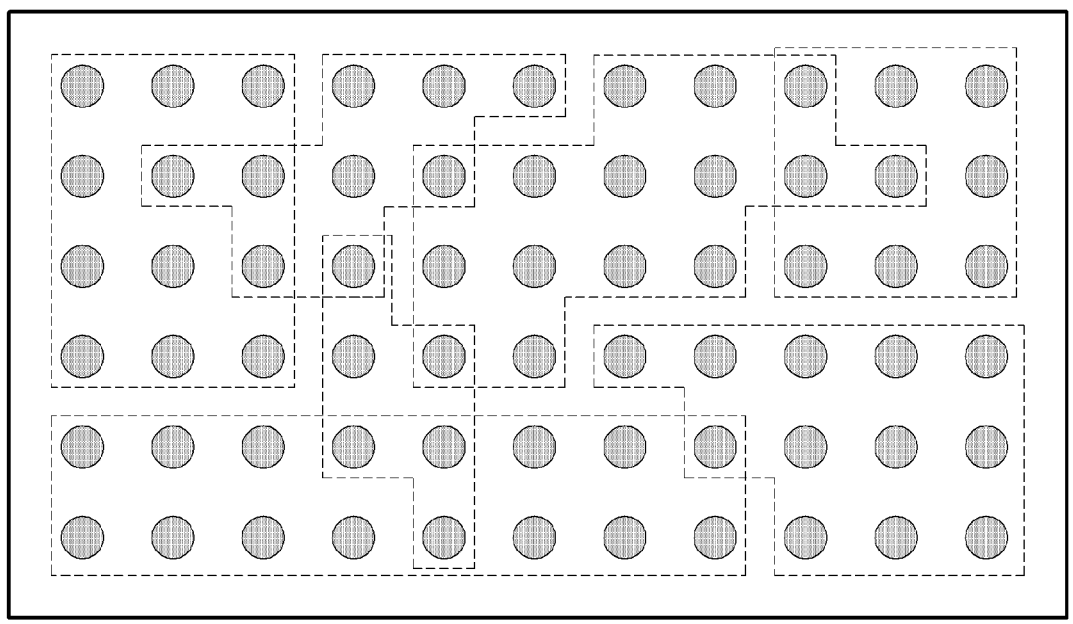
FIG. 5 illustrates an example of coverage expansion through a search for a verification vector.

FIG. 5 illustrates an example of coverage expansion through a search for a verification vector. Referring to the example of FIG. 5, all states to be covered and states covered by each unit verification vector are illustrated. Subsequently, examples of all of the states of the unit elements of the target system to be covered will be referred to as A, a unit verification vector is referred to as $V_i$, at least one state covered by the verification vector $V_i$, from among all of the states A, is referred to as $B_i$, and a coverage corresponding to the states $B_i$, is referred to as $CV_i$.

A verification apparatus may iteratively generate a verification vector $V_i$ satisfying the relationship $B_i \subset A$ until a target value is achieved. When a cumulative coverage reaches the target value, the verification apparatus may determine a verification vector set V based on the verification vectors $V_i$ generated thus far. The cumulative coverage may correspond to at least one state $U_i^k B_i$ covered thus far, from among all the states A. In $U_i^k B_i$, k may denote an iteration count of the number of iterations performed thus far. The obtained verification vector set may be expressed as $V=\{V_1, V_2, \ldots, V_k\}$. When the target value is 100%, the verification apparatus may iteratively generate the verification vector $V_i$ satisfying the relationships $B_i \subset A$ and $U_i^N B_i = A$. In $U_i^N B_i$, N may denote a total iteration count. Thus, the obtained verification vector set may be expressed as $V=\{V_1, V_2, \ldots, V_N\}$. The verification apparatus may search for a smallest verification vector set V, among verification vector sets V satisfying the above conditions.

Figure 6:
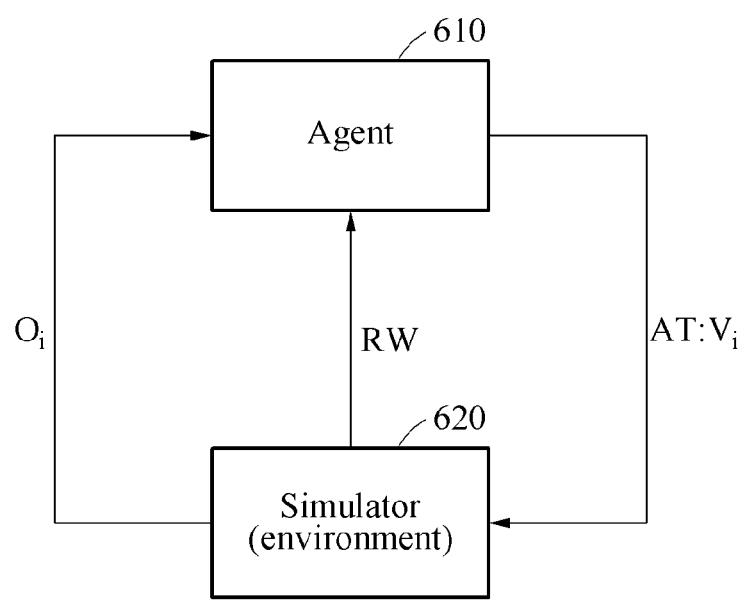
FIG. 6 illustrates an example of a reinforcement learning process.

FIG. 6 illustrates an example of a reinforcement learning process. A verification apparatus may search for a verification vector $V_i$ using a reinforcement learning approach. Referring to the example of FIG. 6, an agent 610 may perform an action AT of generating a verification vector $V_i$ by referring to an observation $O_i$. The observation $O_i$ may indicate a cumulative coverage corresponding to at least one state $U_i^k B_i$ covered thus far, among all states A of unit elements of a target system. In a first episode, where i=k=1, that is, before a verification vector $V_i$ is generated, the observation $O_i$ may have a null value. In reinforcement learning, an episode may indicate an iteration count.

A simulator 620 may identify a coverage $CV_i$ corresponding to at least one state $B_i$ covered by the verification vector $V_i$, from among all the states A. When the coverage $CV_i$ is identified, a reward RW corresponding to the states $B_i$ or the coverage CVi may be provided. For example, the reward RW may be provided based on a range of the states $B_i$ included in the coverage $CV_i$. For example, such a range may be the number of the states $B_i$. When there are states covered in advance, the reward RW may be provided based on states $B_i$ newly covered based on the coverage $CV_i$. The reward RW may be construed as being provided by an environment. The agent 610 may generate a verification vector $V_i$ such that a wider coverage $CV_i$ is secured. Also, a cumulative coverage may widen as generation of a verification vector $V_i$ is iteratively performed.

In a subsequent episode, the observation $O_i$ may be updated based on the coverage $CV_i$. The update operation of the observation $O_i$ may be then expressed as $O_{i+1}=O_i \cup B_i$. Further, the updated observation may be expressed as $O_{i+1}$. The agent 610 may perform an action AT of generating a verification vector $V_{i+1}$ by referring to the updated observation $O_{i+1}$. When the verification vector $V_{i+1}$ is generated, a reward RW corresponding to states $B_{i+1}$ or a coverage $CV_{i+1}$ may be provided, accordingly.

When the above process is iteratively performed a number of times corresponding to a predetermined number of episodes, the verification vector set V may be completed. When a target value of the coverage is not achieved with the verification vector set V, a verification vector set V may be generated again through producing a new episode set. The verification apparatus may train an agent based on a result of performing a previous episode set, to perform a new episode set more efficiently than the previous episode set.

Figure 7:
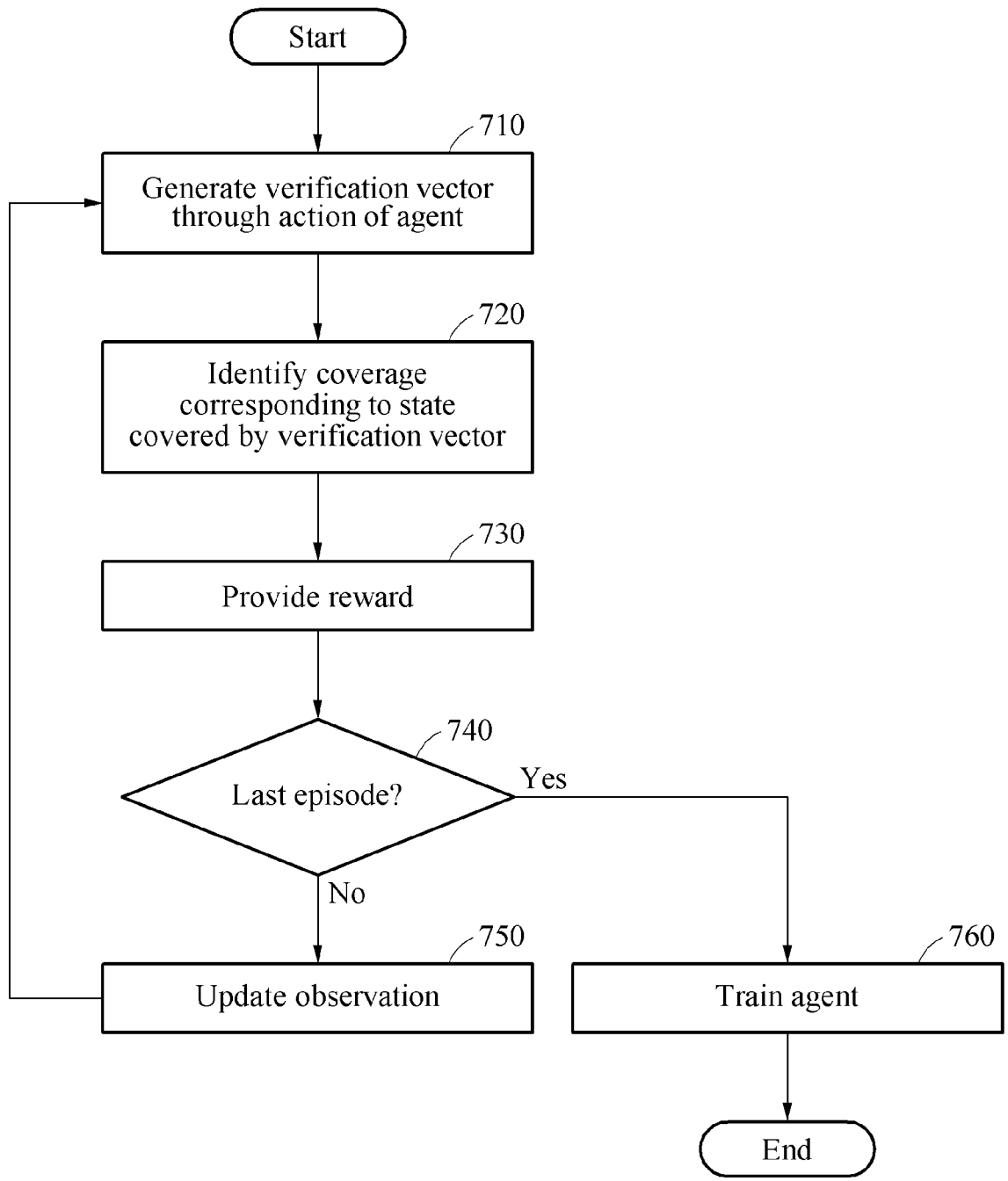
FIG. 7 illustrates an example of a reinforcement learning based system verification method.
Figure 8:
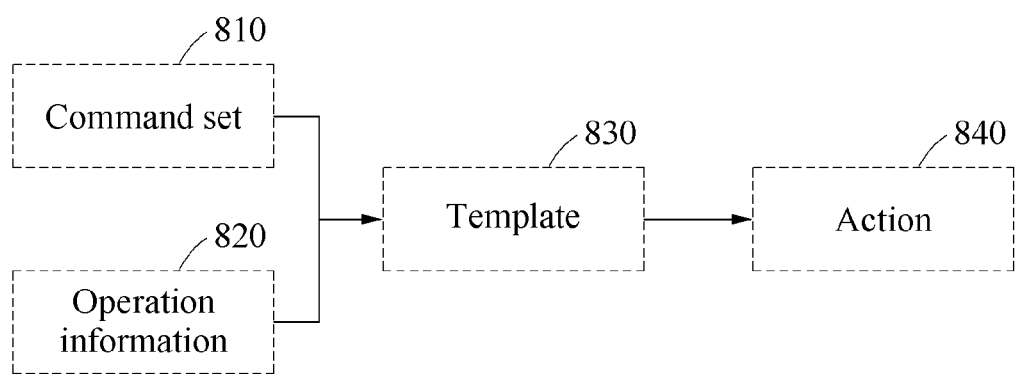

FIG. 7 illustrates an example of a reinforcement learning based system verification method. Referring to the example of FIG. 7, in operation 710, a verification apparatus may generate a verification vector through an action of an agent.

In this example of operation 710, the agent may generate the action by referring to an observation corresponding to at least one state covered thus far, from among states of unit elements of a target system.

The verification apparatus may provide a template corresponding to a combination of commands used in the target system, and the agent may generate the verification vector through the action using the corresponding template. The generation of the action using the template is described further, below, with reference to FIGS. 8 through 11.

FIGS. 8 through 11 illustrate examples of generating an action using a template. Referring to the example of FIG. 8, a verification apparatus may generate a parameterized template 830 based on a command set 810 and operation information 820, and may generate an action 840 using the template 830. The command set 810 may include commands for performing functions of a target system.

Figure 10:
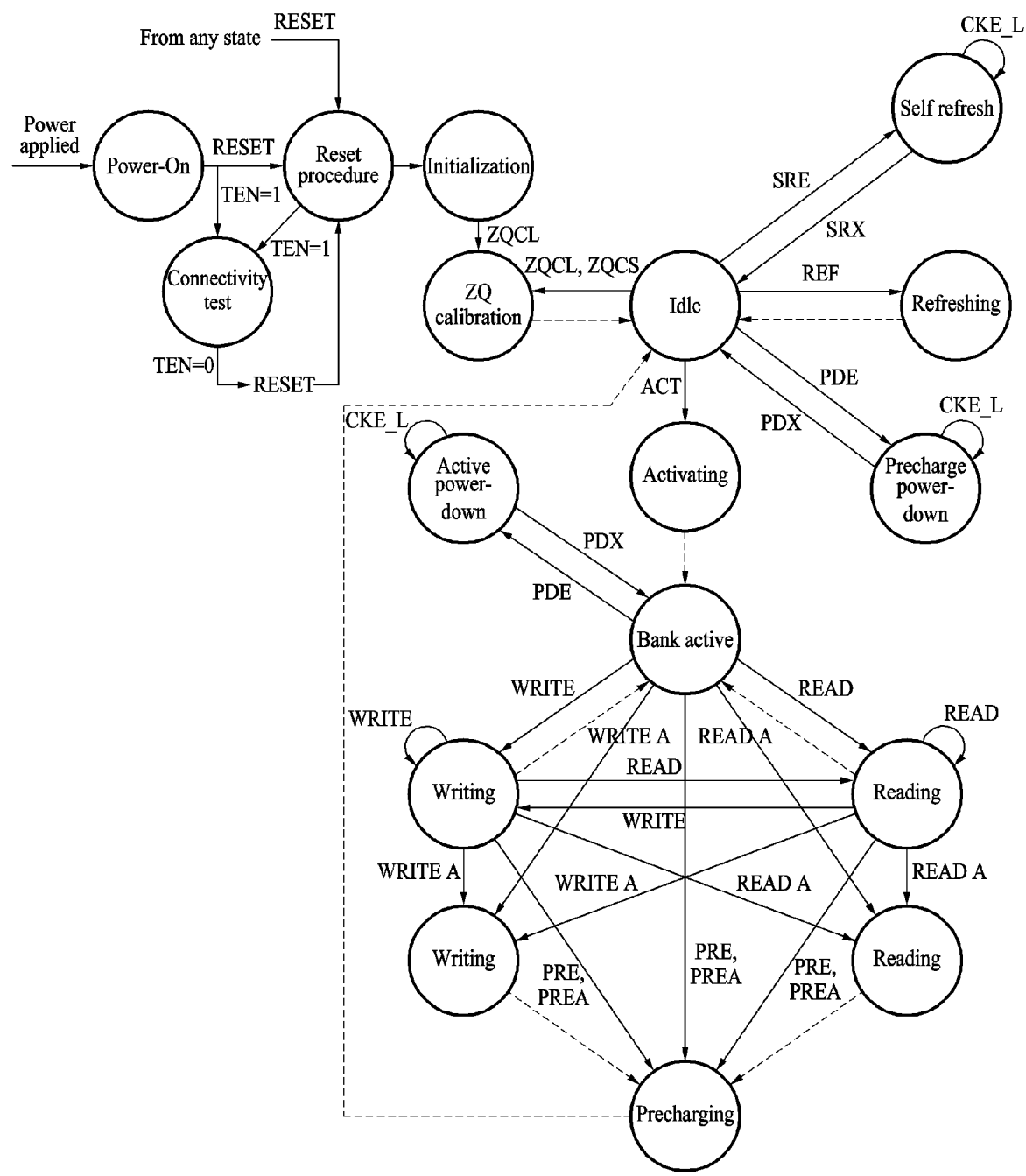

Referring to the example of FIG. 9, a command set is illustrated. The command set of FIG. 9 may include commands for a memory device, such as a memory device under review, and symbols and data corresponding to the commands. The command set of FIG. 9 is provided as an example of the memory device only, and there may be various command sets depending on a target system. Referring to the example of FIG. 10, operation information is illustrated. The operation information of FIG. 10 may include operation states for the memory device. The operation information of FIG. 10 is provided as an example of the memory device only, and there may be a variety of operation information depending on a target system.

Figure 11:
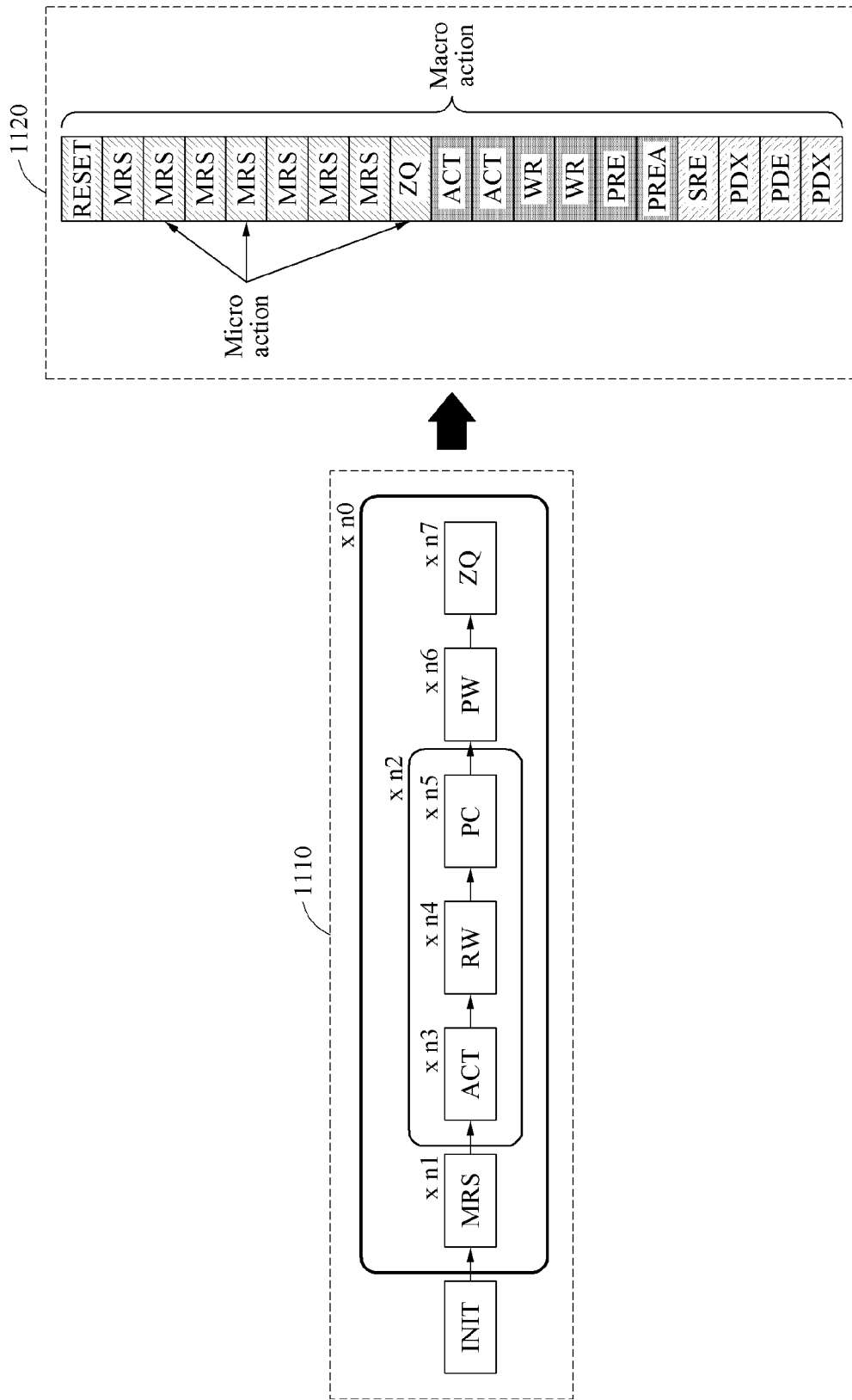

Referring to the example of FIG. 11, a template 1110 and an action 1120 are illustrated. The template 1110 may correspond to a combination of commands used in a target system. For example, blocks of the template 1110 may indicate attributes of the commands, and n0 through n7 may indicate iteration counts of the blocks or block groups. The attributes of the commands and the iteration counts are provided as an example only, and the examples are not limited thereto. The action 1120 may include micro actions. In such an example, each micro action may correspond to a single command. To distinguish the action 1120 from a micro action, the entire action 1120 is referred to as a macro action. The template 1110 and the action 1120 of FIG. 11 are provided as an example of the memory device only, and there may be various templates 1110 and actions 1120 depending on a target system.

Referring to the example of FIG. 7 again, in operation 720, the verification apparatus may identify a coverage corresponding to a state covered by the verification vector. The verification apparatus may measure the coverage by simulating the target system using the verification vector, or may obtain the coverage from action information in an action pool. The action pool is described further in detail with reference to the examples of FIGS. 12 through 14.

Figure 12:
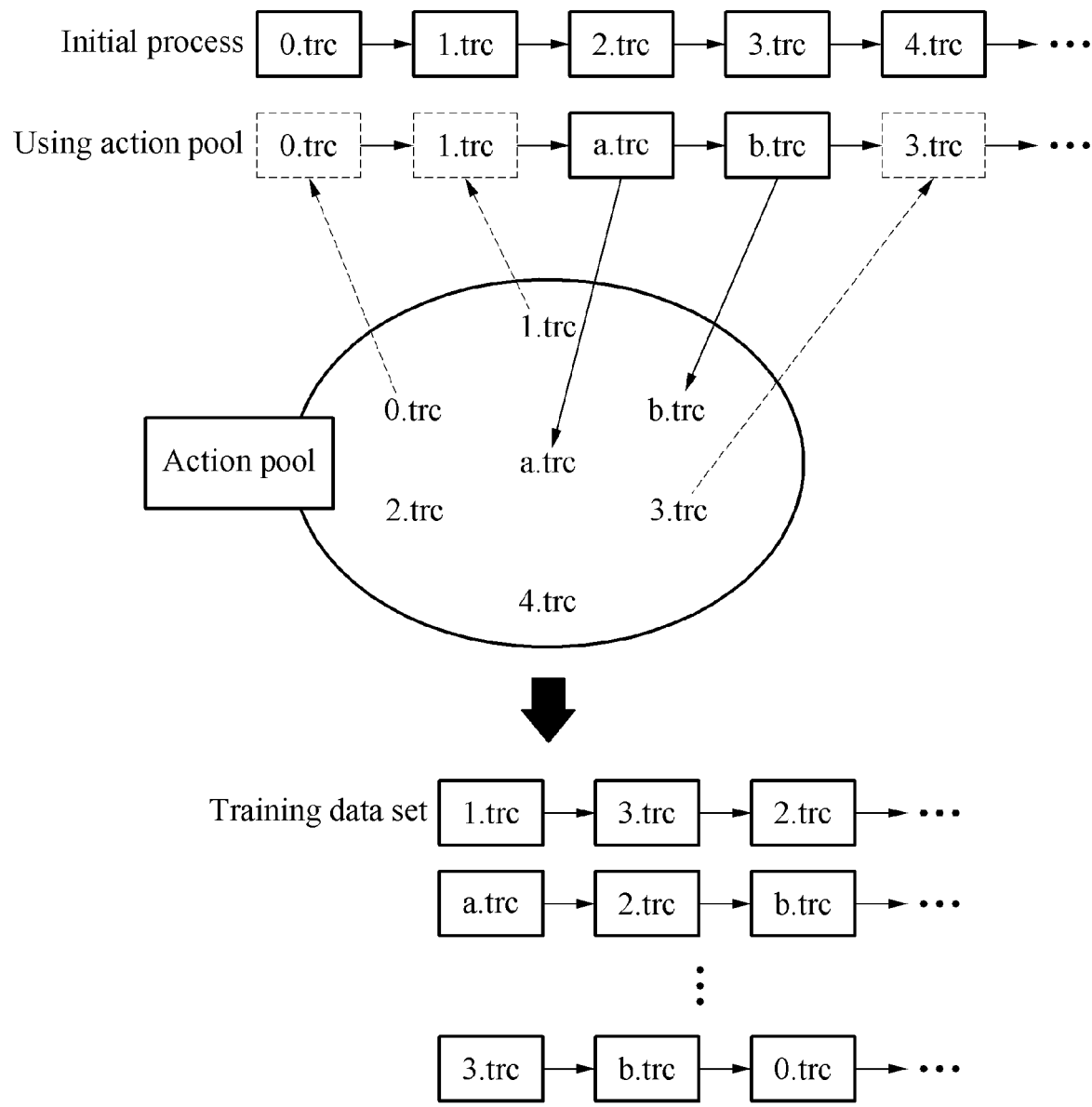
FIG. 12 illustrates an example of an action pool and a training data set.

FIG. 12 illustrates an example of an action pool and a training data set. Referring to the example of FIG. 12, a verification apparatus may store action information related to each action in an action pool. The action information may include micro actions of each action and a coverage corresponding to each action. The verification apparatus, for example, a simulator, may skip a simulation with respect to a predetermined action, as necessary, and may use the action information stored in the action pool.

In further detail, when action information related to an action is absent from the action pool, the verification apparatus may add the action information to the action pool. The action information may be added to the action pool after the action is generated and a coverage is measured through a simulation with respect to the action. In an initial process during which the action pool is almost empty, a majority of action information related to actions may be added to the action pool. In an initial process according to FIG. 12, action information corresponding to 0.trc through 4.trc is entirely added to the action pool. Here, ".trc" indicates a file extension of information used to manage action information in the action pool.

When an episode is iterated a certain number of times, the action pool may contain a certain amount of action information. In this example, the action information in the action pool may be used for identifying a coverage. For example, when action information, hereinafter, referred to as first action information, related to a predetermined action, hereinafter, referred to as a first action, is absent from the action pool, the verification apparatus may measure a coverage, hereinafter, referred to as a first coverage, corresponding to the first action by simulating the target system with a verification vector corresponding to the first action. Conversely, when the first action information is present in the action pool, the verification apparatus may obtain the first coverage from the first action information.

In the example of FIG. 12, action information corresponding to a.trc and b.trc may be absent from the action pool. Thus, to identify coverages of a.trc and b.trc, simulations with respect to a.trc and b.trc may be required. Conversely, because the action information corresponding to 0.trc, the action information corresponding to 1.trc, and the action information corresponding to 3.trc was added to the action pool through using the initial process of FIG. 12, the verification apparatus may identify a coverage of 0.trc, a coverage of 1.trc, and a coverage of 3.trc by referring to the action information in the action pool.

When the action pool is configured, the action pool may be used to generate a training data set. For example, the verification apparatus may generate the training data set by combining at least a portion of actions present in the action pool based on coverages of the actions present in the action pool. The verification apparatus may combine at least a portion of the actions such that a coverage, that is, a reward, is maximized. In further detail, the verification apparatus may determine a sequence of at least a portion of the actions present in the action pool, and may generate the training data set based on the determined sequence.

1.trc-3.trc-2.trc, a.trc-2.trc-b.trc, and 3.trc-b.trc-0.trc of FIG. 12 are training data sets generated through the above process. Because action information related to each action is stored in the action pool, the training data sets may be derived by using a combination of the actions, without performing a separate simulation. Thus, a time for generating a training data set may be reduced accordingly.

A training data set may include a determined sequence and a reward of the determined sequence. The verification apparatus may train an agent with the training data set generated as described above. Thus, the agent may learn optimal action sequences based on training data sets, including the optimal action sequences. Thus, the agent may sequentially generate actions that maximize the coverage, that is, the reward, associated with such actions.

FIG. 13 illustrates an example of generating a training data set. A verification apparatus may determine a sequence of at least a portion of actions present in an action pool, and may generate a training data set based on the determined sequence. For example, the verification apparatus may determine the sequence by performing an operation of selecting an action having a maximum coverage from the actions, and then selecting an action having a maximum coverage from the unselected actions. Referring to the example of FIG. 13, the verification apparatus may determine a sequence of $a_0$-$a_5$-$a_3$-$a_4$ by selecting $a_0$ from actions $a_0$, $a_1$, and $a_5$ as having maximum coverages, from among actions, at a step 0, selecting $a_5$ from actions $a_1$ and $a_5$ as having maximum coverages, from among the remaining actions, at a step 1, and selecting $a_3$ and $a_4$ as having maximum coverages, from among the remaining actions, at a step 2. In a bitmap, 0 may indicate an uncovered state, and 1 may indicate a covered state.

Figure 14:
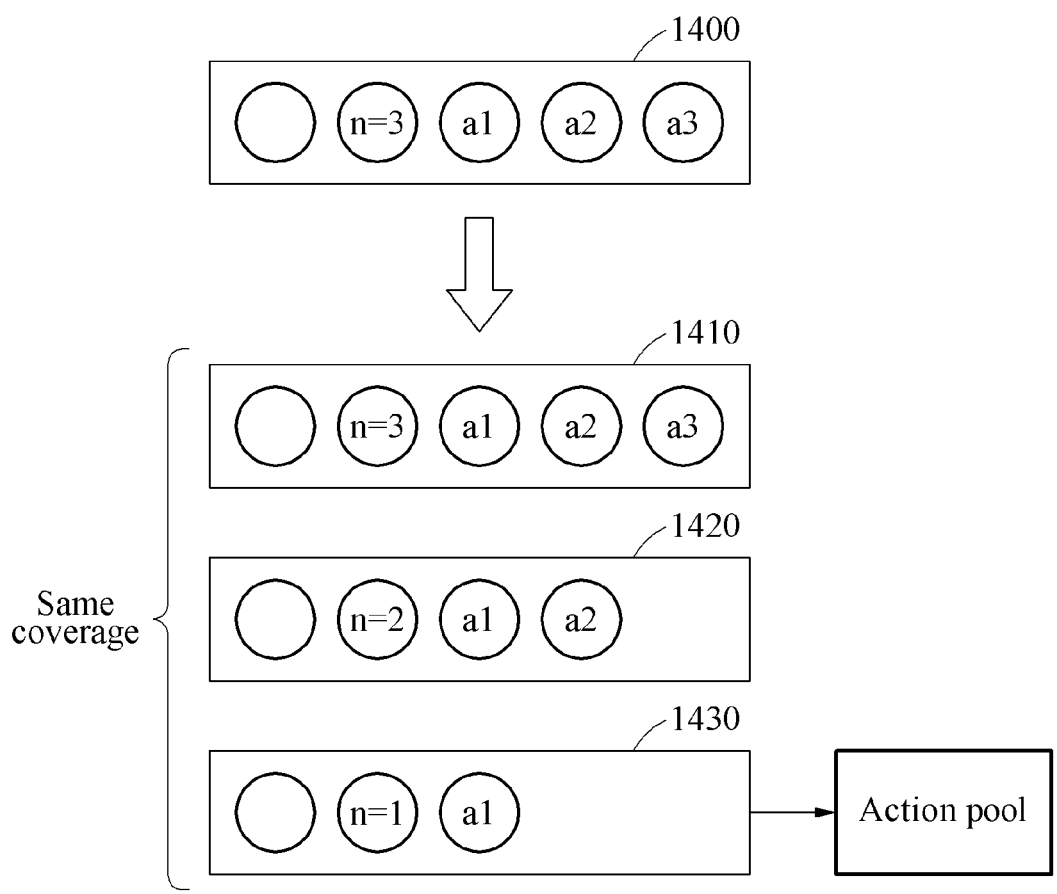
FIG. 14 illustrates an example of reducing an action size.

FIG. 14 illustrates an example of reducing an action size. When adding action information to an action pool, a verification apparatus may add the action information to the action pool in a most efficient form. For example, when there exists at least one command not contributing to a coverage, among commands included in an action, the verification apparatus may configure action information by excluding data related to the corresponding at least one command from the action information.

Referring to the example of FIG. 14, a macro action 1400 may include micro actions a1, a2, and a3. Each micro action may correspond to a single command. For execution of a2 and a3 after execution of a1, it may be assumed that it is impossible to obtain an additional coverage. That is, macro actions 1410, 1420, and 1430 may have the same coverage. Thus, it may be considered that the micro actions a2 and a3 do not contribute to the coverage. Accordingly, in this example, the micro actions a2 and a3 may be excluded from the action information, and the action 1430 not including the micro actions a2 and a3 may be added to the action pool.

Figure 15:
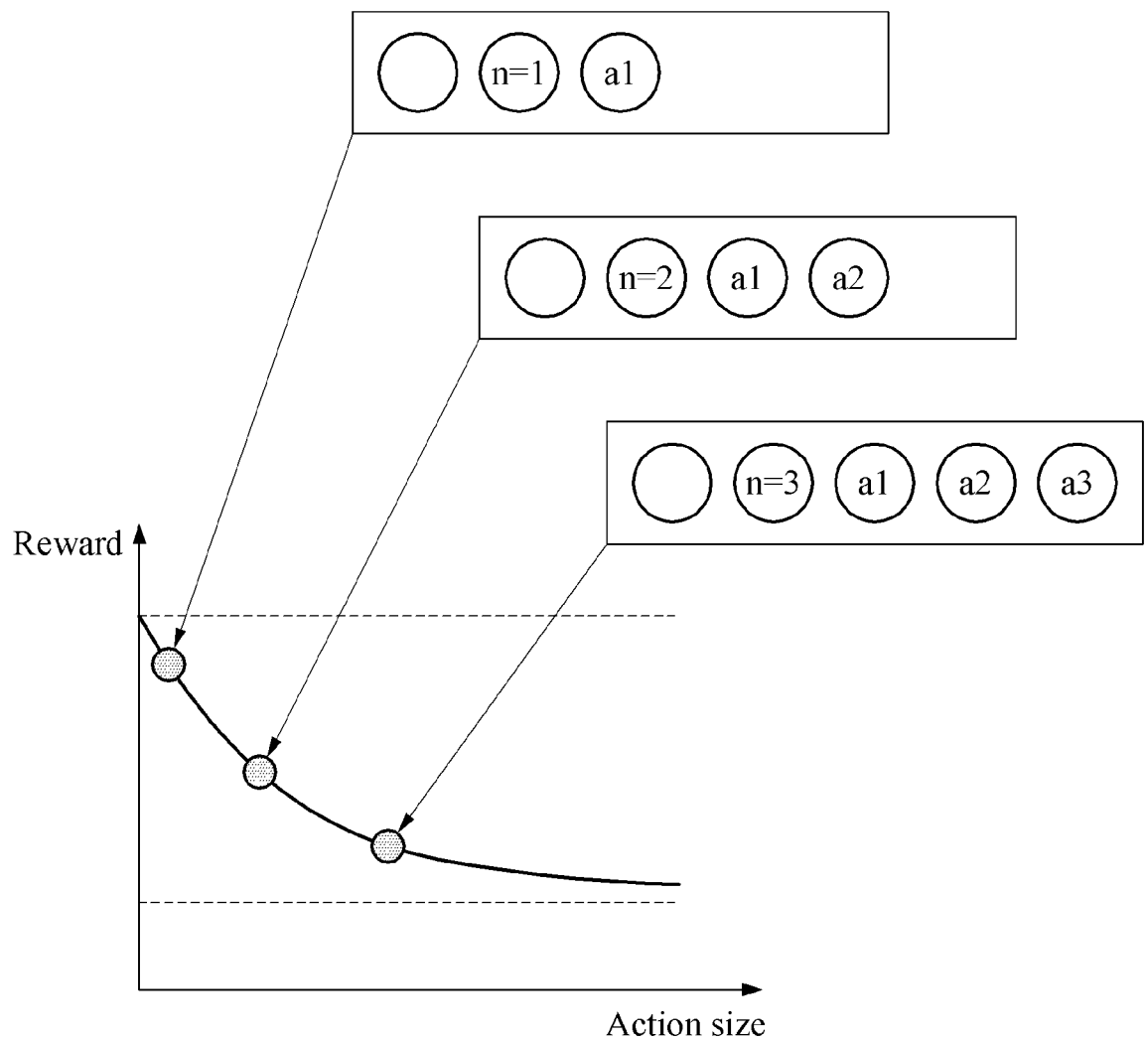
FIG. 15 illustrates an example of a relationship between an action size and a reward.

Referring to the example of FIG. 7 again, in operation 730, the verification apparatus provides a reward. The verification apparatus may provide the reward based on a range of the states, for example, the number of the states, included in the coverage of the action. For example, the verification apparatus may provide a greater reward with respect to a wider range of states included in the coverage of the action. The size of the action may be determined based on the number of micro actions included in the action, and the total size of the micro actions included in the action. FIG. 15 illustrates an example of a relationship between an action size and a reward. It may be assumed that the actions of FIG. 15 may have the same coverage. For actions with the same coverage, a greater reward may be provided with respect to a smaller action size.

In operation 740, the verification apparatus may determine whether a current episode is the last episode. When the current episode is not the last episode, the verification apparatus may update an observation, in operation 750. The verification apparatus may update the observation by reflecting the coverage identified in operation 720, in the observation. When the observation is updated, operations 710 through 730 are performed again. That is, the verification apparatus may generate a new verification vector through a new action of the agent referring to the updated observation, may identifies a coverage corresponding to the new verification vector, and may provide a reward.

When the current episode is the last episode, the verification apparatus may train the agent, in operation 760. The verification apparatus may train the agent using a training data set generated using an action pool. When the training of the agent is completed, a new episode set may be performed through the operations of the example of FIG. 7. Accordingly, the agent may learn an optimal action sequence by using the training process, thereby more efficiently searching a new episode set for a verification vector.

Figure 16:
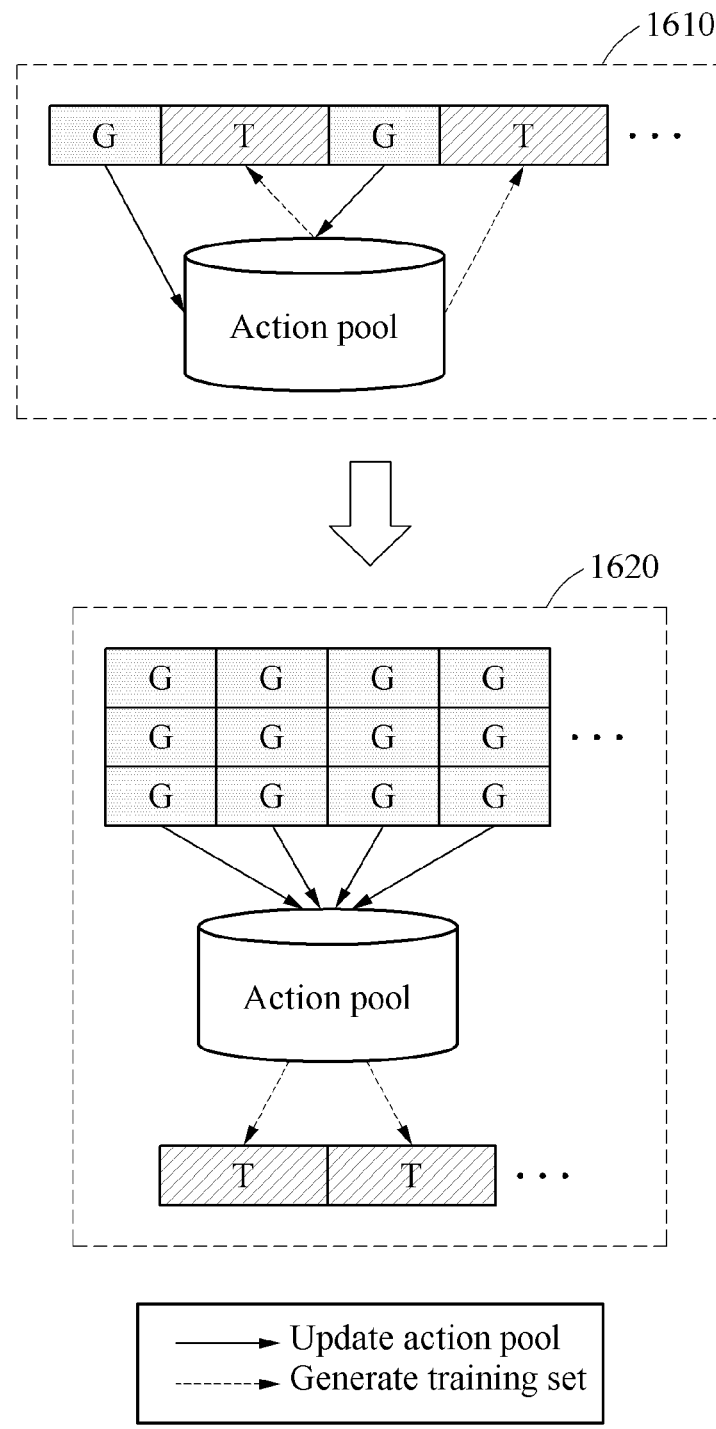
FIG. 16 illustrates an example of an asynchronous process of action generation and training.

FIG. 16 illustrates an example of an asynchronous process of action generation and training. In the example of FIG. 7, the agent may be trained each time a single episode set is completed. In another example, the agent may be trained, when sufficient training data sets are generated, by performing a plurality of episode sets.

In the example of FIG. 16, a process "G" may be updating an action pool through a series of operations such as action generation and coverage identification in a process of performing a single episode set, and a process "T" may be training an agent through using a training data set generated by using an action pool. According to a synchronous process 1610, the process "G" and the process "T" may be performed alternately. For example, the synchronous process 1610 may correspond to the example of FIG. 7.

According to an asynchronous process 1620, the process "G" and the process "T" may be performed asynchronously. That is, agent training through the process "T" may be performed asynchronously with each action generation and each coverage identification through the process "G". In the asynchronous process 1620, respective processes "G" may be performed in parallel, and thus action information in an action pool may be obtained more quickly. Further, in the asynchronous process 1620, the process "T" may be performed independently from the process "G". For example, the process "T" may be performed at a predetermined time interval, or may be performed each time a predetermined quantity of action information is added to the action pool. Thus, a quantity of training data sets used per training may be adjustable, or a quality of training data may be controllable. As a result of the influence on the quality of training data, the training efficiency may increase.

Figure 17:
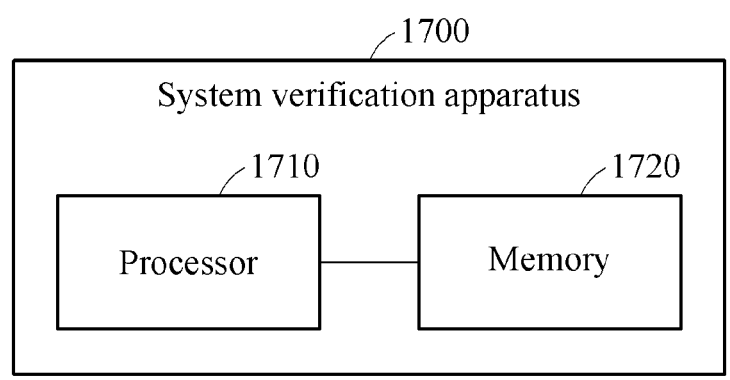
FIG. 17 illustrates an example of a system verification apparatus.

FIG. 17 illustrates an example of a system verification apparatus. Referring to the example of FIG. 17, a system verification apparatus 1700 may include a processor 1710 and a memory 1720. The memory 1720 may store an agent for verification operation, a simulator, and an action pool. Further, the memory 1720 may store commands executable by the processor 1710. When the commands stored in the memory 1720 are executed by the processor 1710, the processor 1710 may perform the verification operations described with reference to the examples of FIGS. 1 through 16. In addition, the description provided above with reference to the examples of FIGS. 1 through 16 is applicable to the system verification apparatus 1700.

The verification apparatus 110, target system 120, agent 610, simulator 620, the system verification apparatus 1700, and other apparatuses, units, modules, devices, and other components described herein with respect to FIGS. 1-17 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-17 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to a processor or computer so that the processor or computer can execute the instructions. In one example, the instructions or software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A system verification method using a machine reinforcement learning agent performing actions of generating verification vectors by referring to respective observations, comprising:

generating a first verification vector corresponding to a first action of the agent referring to an observation corresponding to at least one state already covered, from among states of elements of a target system;

identifying a first coverage corresponding to at least one state covered by the first verification vector, from among the states of the elements;

providing, to the agent, a reward dependent on a range of the states included in the first coverage;

updating the observation by reflecting the first coverage in the observation;

generating a second verification vector corresponding to a second action of the agent referring to the updated observation; and training the agent based on the second verification vector, wherein the identifying comprises:

determining whether first action information related to the first action is in an action pool;

in response to the first action information being absent from the action pool, measuring the first coverage by simulating the target system using the first verification vector and adding the first action information related to the first action to the action pool; and in response to the first action information being present in the action pool, obtaining the first coverage from the first action information comprising information on the first coverage without performing a separate simulation of the target system using the first verification vector, wherein the first coverage corresponds to a size of the first action, the size representing a number of micro actions of the first action, and the reward is based on the size of the first action, and wherein the providing of the reward includes providing a first reward, when the first coverage corresponds to a plurality of states of the elements of the target system, that is greater than a second reward that is provided when the first coverage corresponds to less than the plurality of states of the elements of the target system.

2. The system verification method of claim 1, wherein the generating of the first verification vector comprises generating the first verification vector using a template corresponding to a combination of commands used in the target system.

3. The system verification method of claim 1, further comprising:

generating a training data set by combining at least a portion of actions present in the action pool based on coverages of the actions present in the action pool; and training the agent using the training data set.

4. The system verification method of claim 3, wherein the generating of the training data set comprises:

determining a sequence of at least a portion of the actions present in the action pool; and generating the training data set based on the determined sequence.

5. The system verification method of claim 3, wherein the training is performed asynchronously with respect to the generating of the first verification vector and the identifying.

6. The system verification method of claim 1, further comprising:

in response to commands included in the first action comprising at least one command not contributing to the first coverage, excluding data related to the at least one command from the first action information.

7. The system verification method of claim 1, wherein the target system corresponds to either one or both of a circuit and a machine.

8. The system verification method of claim 7, wherein the states of the elements correspond to inputs of the elements.

9. The system verification method of claim 1, further comprising:

determining a verification vector set based on plural verification vectors already generated, in response to a cumulative coverage corresponding to the observation reaching a target value.

10. A non-transitory computer-readable storage medium storing instructions that, when executed by a processor, using a machine reinforcement learning agent performing actions of generating verification vectors by referring to respective observation, configure the processor to:

generate a first verification vector corresponding to a first action of the agent referring to an observation corresponding to at least one state already covered, from among states of elements of a target system;

identify a first coverage corresponding to at least one state covered by the first verification vector, from among the states of the elements;

provide, to the agent, a reward dependent on a range of the states included in the first coverage, update the observation by reflecting the first coverage in the observation;

generate a second verification vector corresponding to a second action of the agent referring to the updated observation; and train the agent based on the second verification vector, wherein the identifying comprises:

determining whether first action information related to the first action is in an action pool;

in response to the first action information being absent from the action pool, measuring the first coverage by simulating the target system using the first verification vector and adding the first action information related to the first action to the action pool;

in response to the first action information being present in the action pool, obtaining the first coverage from the first action information comprising information on the first coverage without performing a separate simulation of the target system using the first verification vector, wherein the first coverage corresponds to a size of the first action, the size representing a number of micro actions of the first action, and the reward is based on the size of the first action, and wherein the providing of the reward includes providing a first reward, when the first coverage corresponds to a plurality of states of the elements of the target system, that is greater than a second reward that is provided when the first coverage corresponds to less than the plurality of states of the elements of the target system.

11. A system verification apparatus using a machine reinforcement learning agent performing actions of generating verification vectors by referring to respective observations, comprising:

one or more processors configured to:

generate a first verification vector corresponding to a first action of the agent referring to an observation corresponding to at least one state already covered, from among states of elements of a target system, identify a first coverage corresponding to at least one state covered by the first verification vector, from among the states of the elements, provide, to the agent, a reward dependent on a range of the states included in the first coverage, update the observation by reflecting the first coverage in the observation, generate a second verification vector corresponding to a second action of the agent referring to the updated observation, and train the agent based on the second verification vector, wherein the one or more processors are configured to:

determine whether first action information related to the first action is in an action pool;

in response to the first action information being absent from the action pool, measure the first coverage by simulating the target system with the first verification vector and adding the first action information related to the first action to the action pool;

in response to the first action information being present in the action pool, obtain the first coverage from the first action information comprising information on the first coverage without performing a separate simulation of the target system using the first verification vector, wherein the first coverage corresponds to a size of the first action, the size representing a number of micro actions of the first action, and the reward is based on the size of the first action, and wherein the providing of the reward includes providing a first reward, when the first coverage corresponds to a plurality of states of the elements of the target system, that is greater than a second reward that is provided when the first coverage corresponds to less than the plurality of states of the elements of the target system.

12. The system verification apparatus of claim 11, further comprising a memory configured to store instructions, wherein the processor is further configured to execute the instructions to configure the processor to perform the generation of the first verification vector, perform the identification of the first coverage, perform the updating of the observation, and the generation of the second verification vector.

13. The system verification apparatus of claim 11, wherein the one or more processors are configured to generate the first verification vector using a template corresponding to a combination of commands used in the target system.

14. The system verification apparatus of claim 11, wherein the one or more processors are configured to generate a training data set by combining at least a portion of actions present in the action pool based on coverages of the actions present in the action pool, and train the agent with the training data set.

15. The system verification apparatus of claim 11, wherein the one or more processors are configured to determine a verification vector set based on plural verification vectors already generated, in response to a cumulative coverage corresponding to the observation reaching a target value.

16. The system verification method of claim 1,
wherein the reward is greater than a previous reward provided to the agent for a previous verification vector corresponding to a previous action having a lesser size than the size of the first action, and wherein the reward is less than another previous reward provided to the agent for another previous verification vector corresponding to another previous action having a greater size than the size of the first action.

17. The system verification method of claim 1, further comprising:
combining the micro actions of each action in the action pool based on a respective coverage corresponding to each action present in the action pool.

18. The system verification method of claim 1, wherein the measuring of the first coverage by simulating the target system using the first verification vector is performed before adding the first action information related to the first action to the action pool.

* * * * *